(12) United States Patent
Aliane et al.

(10) Patent No.: US 11,508,870 B2
(45) Date of Patent: Nov. 22, 2022

(54) PROCESS FOR FABRICATING AT LEAST ONE TENSILELY STRAINED PLANAR PHOTODIODE

(71) Applicant: Commissariat a l'Energie Atomique et aux Energies Alternatives, Paris (FR)

(72) Inventors: Abdelkader Aliane, Grenoble (FR); Jean-Louis Ouvrier-Buffet, Grenoble (FR)

(73) Assignee: Commissariat a l'Energie Atomique et aux Energies Alternatives, Paris (FR)

(*) Notice: Subject to any disclaimer, the term of this patent is extended or adjusted under 35 U.S.C. 154(b) by 187 days.

(21) Appl. No.: 17/065,646

(22) Filed: Oct. 8, 2020

(65) Prior Publication Data
US 2021/0104644 A1 Apr. 8, 2021

(30) Foreign Application Priority Data
Oct. 8, 2019 (FR) ..................................... 19 11123

(51) Int. Cl.
*H01L 31/18* (2006.01)
*H01L 31/0216* (2014.01)
(Continued)

(52) U.S. Cl.
CPC ...... *H01L 31/1812* (2013.01); *H01L 31/0216* (2013.01); *H01L 31/105* (2013.01); *H01L 31/1037* (2013.01)

(58) Field of Classification Search
CPC ............. H01L 31/1812; H01L 31/0216; H01L 31/1037; H01L 31/105; H01L 31/109;
(Continued)

(56) References Cited

U.S. PATENT DOCUMENTS

| 6,707,075 B1 * | 3/2004 | Rogers ................ H01L 31/1804 |
| | | 257/E27.128 |
| 11,127,875 B2 * | 9/2021 | Aliane .............. H01L 31/02161 |

(Continued)

FOREIGN PATENT DOCUMENTS

| FR | 2 979 037 A1 | 2/2013 |
| WO | WO 2018/050996 A1 | 3/2018 |

OTHER PUBLICATIONS

French Preliminary Search Report dated Jun. 9, 2020 in French Application 19 11123 filed on Oct. 8, 2019 (with English Translation of Categories of Cited Documents & Written Opinion), 13 pages.

*Primary Examiner* — Bitew A Dinke
(74) *Attorney, Agent, or Firm* — Oblon, McClelland, Maier & Neustadt, L.L.P.

(57) ABSTRACT

The invention relates to a process for fabricating at least tensilely strained planar photodiode 1, comprising producing a stack formed from a semiconductor layer 53, 55 made of a first material and from an antireflection layer 20; producing a peripheral trench 30 that opens onto a seed sublayer 22 made of a second material of the antireflection layer 20; epitaxy of a peripheral section 31 made of the second material in the peripheral trench 30; and returning to room temperature, a detecting section 10 then being tensilely strained because of the difference in coefficients of thermal expansion between the two materials.

10 Claims, 6 Drawing Sheets

(51) Int. Cl.
*H01L 31/103* (2006.01)
*H01L 31/105* (2006.01)

(58) Field of Classification Search
CPC ............ H01L 31/1075; H01L 31/1868; H01L 31/101; H01L 33/0004; H01L 33/005; H01L 33/20; H01L 33/44; G01J 1/42
See application file for complete search history.

(56) References Cited

U.S. PATENT DOCUMENTS

| | | | |
|---|---|---|---|
| 11,264,425 B2* | 3/2022 | Ouvrier-Buffet | ... H01L 31/1804 |
| 2003/0235931 A1 | 12/2003 | Wada et al. | |
| 2005/0040411 A1* | 2/2005 | Wada | .................. H01L 31/1808 257/79 |
| 2009/0008566 A1* | 1/2009 | Agarwal | ........... H01L 27/14683 257/438 |
| 2010/0133585 A1* | 6/2010 | Kim | .................... H01L 21/0245 117/88 |
| 2013/0039664 A1 | 2/2013 | Clifton et al. | |
| 2013/0202005 A1 | 8/2013 | Dutt | |
| 2014/0191115 A1* | 7/2014 | Webster | ................. H01L 31/107 250/214 R |
| 2014/0369372 A1 | 12/2014 | Clifton et al. | |
| 2015/0249320 A1 | 9/2015 | Clifton et al. | |
| 2016/0211649 A1 | 7/2016 | Clifton et al. | |
| 2017/0176184 A1* | 6/2017 | Lee | ........................... G01C 3/02 |
| 2018/0062352 A1 | 3/2018 | Clifton et al. | |
| 2019/0115726 A1 | 4/2019 | Clifton et al. | |
| 2019/0198701 A1* | 6/2019 | Moussy | ............ H01L 31/03682 |
| 2019/0280145 A1* | 9/2019 | Natsuaki | ............. H01L 31/0203 |
| 2019/0288026 A1* | 9/2019 | Von Kaenel | ........ H01L 27/1463 |
| 2021/0111205 A1* | 4/2021 | Aliane | ................ H01L 41/1876 |
| 2022/0093812 A1* | 3/2022 | Aliane | .................. H01L 31/105 |

* cited by examiner

PROCESS FOR FABRICATING AT LEAST ONE TENSILELY STRAINED PLANAR PHOTODIODE

TECHNICAL FIELD

The field of the invention is that of optoelectronic devices comprising at least one planar photodiode made based on a tensilely strained semiconductor compound and for example based on germanium. The invention is notably applicable to the field of detection of light radiation belonging for example to the near infrared, for example in the field of optical telecommunications and infrared imaging.

PRIOR ART

In various microelectronic or optoelectronic applications, it may be advantageous to use a layer made of a crystalline, and preferably single-crystal, semiconductor compound having a tensile mechanical strain. This is notably the case in certain optical devices the material of the optically active layer of which has, unstrained, an indirect electronic band structure, the band structure then being made direct by applying a sufficient tensile strain. The crystalline semiconductor compound may be a compound based on germanium, for example germanium, germanium-tin, or even silicon-germanium.

Thus, document US2014/0291682 describes an avalanche photodiode the absorbing semiconductor layer of which is made of tensilely strained germanium. The photodiode is then suitable for absorbing light radiation up to a cut-off wavelength higher than 1550 nm, which is the cut-off wavelength of absorption of relaxed germanium. To this end, the germanium layer is coated with a strain-inducing layer formed from a stack of sublayers made of silicon nitride, silicon oxide and amorphous silicon. However, this photodiode notably has the drawback of being obtained using techniques for engineering mechanical strain by depositing a stack of thin layers, this possibly making the fabricating process complex.

Document EP3151265 describes a diode-comprising optoelectronic device containing a tensilely strained semiconductor layer made based on germanium. The semiconductor layer was strained here via prior localized structuring of the layer, then via suspension of the structured layer above a substrate, followed by attachment to the latter by direct bonding. A consolidating anneal is lastly carried out in order to improve the mechanical strength of the strained structured layer bonded to the substrate. However, this optoelectronic device notably has the drawback of being obtained using a relative complex fabricating process. In addition, as in the preceding document, control of the value of the tensile strain actually experienced by the semiconductor layer may be particularly difficult.

SUMMARY OF THE INVENTION

The objective of the invention is to at least partially remedy the drawbacks of the prior art, and more particularly to provide a process for fabricating at least one planar photodiode that allows a tensile mechanical strain to be generated in the photodiode in a simple and precise way.

To this end, the subject of the invention is a process for fabricating at least one planar photodiode, comprising the following steps:
producing a stack formed: from at least one semiconductor layer made based on a first crystalline semiconductor; and from an antireflection layer that extends in contact with a first face of the semiconductor layer and that is formed from a plurality of sublayers that lie parallel to one another, including a sublayer referred to as the seed sublayer which is made based on a second crystalline semiconductor having a coefficient of thermal expansion lower than that of the first crystalline semiconductor;
producing at least one peripheral trench that extends through the semiconductor layer from a second face thereof opposite the first face and that opens onto the seed sublayer, bounding a section, referred to as the detecting section, of the semiconductor layer;
producing a peripheral section made of the second crystalline semiconductor by epitaxy from the seed sublayer at a temperature, referred to as the epitaxy temperature, higher than room temperature, entirely filling the peripheral trench and thus being in contact with the detecting section;
decreasing the temperature to a value lower than the epitaxy temperature, the detecting section then being tensilely strained by the peripheral section.

The following are certain preferred but non-limiting aspects of this fabricating process.

The fabricating process may comprise the following steps:
producing a first substrate comprising a first semiconductor layer made of the first crystalline semiconductor, this layer being coated with a first bonding dielectric layer;
producing a second substrate comprising a layer made of the second crystalline semiconductor, this layer being intended to form the seed sublayer, being coated with a second bonding dielectric layer and being joined to a carrier layer by an insulating layer;
joining the two substrates to each other by direct bonding of the first and second bonding dielectric layers, and thus obtaining the antireflection layer, the first and second bonding dielectric layers forming a first sublayer of the antireflection layer and the insulating layer forming a third sublayer of the antireflection layer.

The antireflection layer may comprise a first sublayer formed by the first and second bonding dielectric layers, the seed sublayer of the second substrate, and a third sublayer formed by the insulating layer of the second substrate.

The detecting section may be made based on germanium, and the peripheral section and the seed sublayer may be made based on silicon.

The epitaxy temperature may be comprised between 500° C. and 700° C.

A plurality of planar photodiodes may be produced, the seed sublayer extending continuously facing each photodiode, the peripheral sections being produced by epitaxy from the seed sublayer.

Another objective of the invention is provide an optoelectronic device comprising at least one planar photodiode and preferably a matrix array of planar photodiodes, having a small bulk and, in the case of the matrix array of photodiodes, a high spatial resolution, and capable of being obtained using a simplified fabricating process.

The optoelectronic device may comprise at least one planar photodiode, said photo diode comprising:
a detecting section that has a first face and a second face parallel to each other, that is made of a first crystalline semiconductor and that is tensilely strained in a plane parallel to said faces;

an antireflection layer that extends over and in contact with the first face of the detecting section, this layer being formed from a plurality of sublayers that lie parallel to one another, including a sublayer referred to as the seed sublayer, which is made based on a second crystalline semiconductor having a coefficient of thermal expansion lower than that of the first crystalline semiconductor;

a peripheral section made of the second crystalline semiconductor, this section extending around and in contact with the detecting section, and in contact, under an epitaxy relationship, with the seed sublayer.

The peripheral section may protrude with respect to the first face and with respect to the second face.

The detecting section may comprise a first region that is doped a first conductivity type and that lies flush with the second face, and a second region that is doped a second conductivity type opposite the first type and that lies flush with the first face and that is in contact with the peripheral section, the peripheral section being doped the second conductivity type.

The detecting section may comprise an intermediate region that is intrinsic or doped the second conductivity type, separating the first region from the second region.

The peripheral section may encircle the detecting section continuously.

BRIEF DESCRIPTION OF THE DRAWINGS

Other aspects, aims, advantages and features of the invention will become more apparent on reading the following detailed description of preferred embodiments thereof, given by way of non-limiting example with reference to the appended drawings, in which.

DETAILED DISCLOSURE OF PARTICULAR EMBODIMENTS

In the figures and in the following description, the same references represent identical or similar elements. In addition, the various elements are not shown to scale for the sake of clarity of the figures. Furthermore, the various embodiments and variants are not mutually exclusive and may be combined with one another. Unless otherwise indicated, the terms "substantially", "about" and "of the order of" mean to within 10%, and preferably to within 5%. In addition, the terms "comprised between . . . and . . . " and equivalents mean inclusive of limits, unless otherwise specified.

The invention notably relates to a process of fabricating at least one planar photodiode, and preferably a matrix array of planar photodiodes. Each photodiode is preferably suitable for detecting light radiation in the near infrared (SWIR, for Short Wavelength IR) corresponding to the spectral range extending from 0.8 μm to about 1.7 μm, or even to about 2.5 μm, and is preferably made based on germanium.

The photodiodes are said to be planar insofar as they extend, about the same main plane, between first and second faces that are parallel and opposite to each other. They each comprise a semiconductor section, referred to as the detecting section, within which a PN or PIN junction is present, having a substantially constant thickness between the first and second faces. Each photodiode comprises a first region doped a first conductivity type, for example n+-type, flush with one of the faces and forming an n+-doped well, a second region doped a second conductivity type, for example p+-type, flush with the opposite face, and an intermediate region located between the two doped regions and encircling the n+-doped first region in the main plane. This intermediate region may be doped the second conductivity type, for example p-type, to form a PN junction, or be intrinsic, that is to say unintentionally doped, to form a PIN junction. The planar photodiodes then do not have a mesa structure, and are optically isolated from one another by peripheral trenches filled with a crystalline semiconductor doped the second conductivity type, forming semiconductor sections that are referred to as peripheral sections.

The detecting section of the planar photodiode is encircled, in a main plane of the photodiode, by a peripheral section. As described in detail below, the peripheral section ensures, during the fabricating process, that the detecting section is strained in the main plane, because the doped semiconductor is produced so as to fill the peripheral trench at an epitaxy temperature higher than room temperature, this doped semiconductor having a coefficient of thermal expansion lower than that associated with the detecting section.

Moreover, the doped semiconductor is a crystalline material produced by epitaxy from a seed sublayer belonging to an antireflection layer that lies opposite the detecting section. The peripheral section, by virtue of the fact that it is linked by epitaxy to the seed sublayer, allows the detecting section to be kept tensilely strained.

Thus, the photodiode according to the invention comprises a section for detecting the light radiation to be detected, this section being tensilely strained in the main plane, a peripheral section which is used to electrically bias and optically isolate the photodiodes and to strain the detecting section, and an antireflection layer which allows the reflection of the light radiation of interest at the surface of the photodiode to be decreased and ensures that the tensile strain is maintained in the detecting section via the epitaxial link between the peripheral section and the seed sublayer.

The tensile strain experienced by the detecting section then result in a modification of the optical and/or electrical properties of the photodiode, such as, for example, a widening of the spectral range of absorption of light radiation. The induced tensile strain may also be sufficient to make the electronic band structure of the semiconductor compound of the detecting section (e.g. germanium) substantially direct, in the case where the latter has an indirect band structure when it is in the relaxed state.

In general, by strained section what is meant a section made of a crystalline semiconductor compound that is tensilely or compressively mechanically stressed so as to deform the unit cells of its crystal lattice. The section is tensilely strained when it experiences a mechanical stress that tends to stretch the unit cells of the lattice in a plane. In the context of the invention, the detecting section is tensilely strained in a main plane of the photodiode, parallel to said first and second faces. This means that its lattice parameter, in the main plane, has a value, referred to as its effective value, higher than its natural value when the semiconductor compound is relaxed (i.e. unstrained). In the rest of the description, unless otherwise indicated, the strain in question is oriented in the main plane of the photodiode.

The crystalline semiconductor of the detecting section, which thus experiences a tensile mechanical strain, therefore exhibits modified optical and/or electrical properties. In particular, its band gap energy, in particular that associated with the Γ valley (or direct valley) may be narrower. The band gap may be estimated depending on the tensile deformation, as described in the case of a germanium layer in the publication by Guilloy et al. titled *Germanium under high tensile stress: Nonlinear dependence of direct band gap vs strain*, ACS Photonics 2016, 3, 1907-1911. Moreover, the mechanical tensile strain experienced by the detecting section may be sufficient for the electronic band structure to become direct.

By direct band structure, what is meant is that the minimum energy $E_{BC,L}$ of the conduction band of the L valley (or indirect valley) is higher than or substantially equal to the minimum of energy $E_{BC,\Gamma}$ of the conduction band of the Γ valley (or direct valley), or in other words: $\Delta E = E_{BC,L} - E_{BC,\Gamma} \geq 0$. By substantially equal, what is meant here is that this energy difference is of the order of magnitude of or less than kT, where k is Boltzmann's constant and T the temperature of the material. Preferably, the detecting semiconductor section is made based on germanium, the electronic band structure of which is indirect in the relaxed state (in other words $\Delta E < 0$) and becomes direct when it experiences a sufficient tensile deformation.

For the sake of clarity, a planar photodiode comprising a detecting section having a tensile mechanical strain will be described first. Preferably, the detecting section is made of a crystalline semiconductor the electronic band structure of which is made direct by the tensile mechanical strain.

Figure 1A:
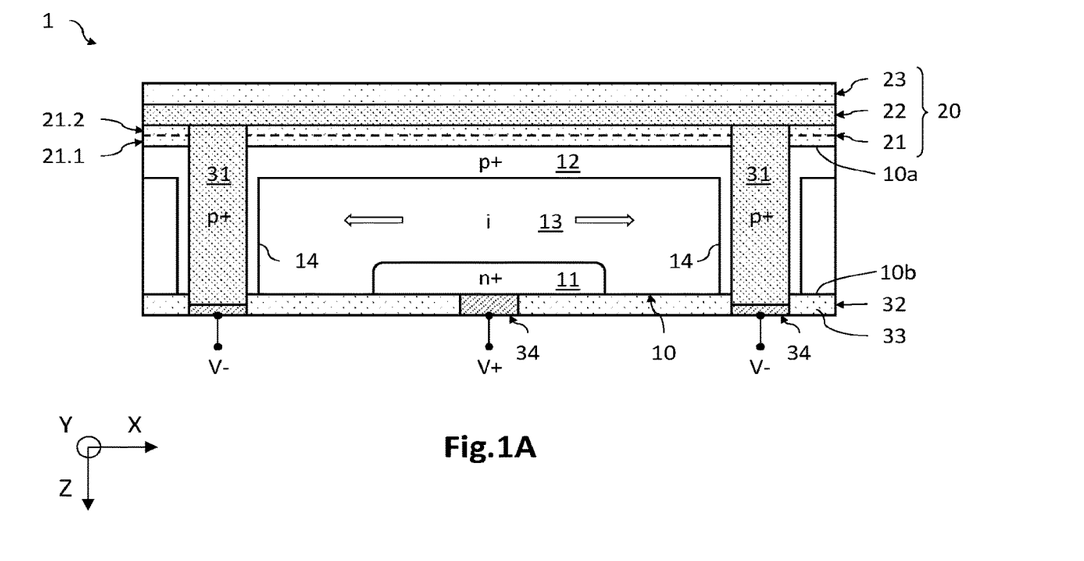
FIG. 1A is a schematic and partial cross-sectional view of a planar photodiode according to one embodiment.

FIG. 1A is a partial and schematic cross-sectional view of a planar photodiode 1 belonging to a matrix array of photodiodes 1. In this example, the photodiodes 1 are here made based on germanium. They are reverse biased from a face 10*b* and are optically isolated from one another by peripheral trenches 30 that are filled with a doped crystalline semiconductor, here based on p+-doped silicon.

A three-dimensional direct coordinate system (X, Y, Z), in which the X- and Y-axes form a plane parallel to the main plane of the photodiodes 1, and in which the Z-axis is oriented in the direction of the thickness of the detecting section 10 of the photodiode 1, from the first face 10*a* towards the second face 10*b*, is defined here and for the rest of the description.

The photodiode 1 comprises a detecting section 10 that extends along the Z-axis between first and second faces 10*a*, 10*b* that lie parallel to each other and opposite to each other. The first and second faces 10*a*, 10*b* are common to each photodiode 1 of the matrix array. They may be substantially planar, so that the detecting section 10 has a thickness along the Z-axis that is substantially constant, for example comprised between a few hundred nanometers and a few microns, and for example comprised between about 1 μm and 5 μm. The thickness is chosen so as to obtain good absorption in the wavelength range of the light radiation to be detected. The detecting section 10 is bounded, in the XY-plane, by a lateral border 10*c* that connects the two faces 10*a*, 10*b* to each other. The lateral border 10*c* may lie substantially parallel to the Z-axis. The detecting section 10 has a transverse dimension in the XY-plane that may be comprised between a few hundred nanometers and about one hundred microns, and for example comprised between about 1 μm and 20 μm.

The detecting section 10 is made based on a first crystalline, and preferably single-crystal, semiconductor, and here based on germanium. By "based on" what is meant is that the detecting section 10 is made of the first crystalline semiconductor or of a compound formed from at least the first crystalline semiconductor. The first crystalline semiconductor is advantageously germanium, and hence the photodiodes 1 are made of germanium Ge, of silicon-germanium SiGe, of germanium-tin GeSn, or of silicon-germanium-tin SiGeSn. In this example, the detecting section 10 is made of germanium.

The detecting section 10 is thus formed from a first region 11 doped a first conductivity type, here n+-type, which is flush with the face 10*b* and forms an n+-doped well, and a second region 12 doped a second conductivity type opposite the first type, here p+-type, which is flush with face 10*a*. By flush, what is meant is "to reach the level of", or "to extend from". An intermediate region 13 that is intrinsic (in the case of a PIN junction), or doped the second conductivity type (in the case of a PN junction), is located between and in contact with the two doped regions 11, 12, and encircles the n+-doped first region 11 in the XY-plane. In this example, the semiconductor junction is of the PIN type, the first region 11 being doped n+-type, the second region 12 doped p+-type, and the intermediate region 13 being intrinsic (not intentionally doped).

The n+-doped first region 11 here extends from the face 10*b* and is encircled by the intermediate region 13 in the XY-plane. It is located away from the lateral border 10*c* of the detecting section 10 in the XY-plane. It thus forms an n+-doped well that is flush with the face 10*b* and that is spaced apart by a non-zero distance from the lateral border 10*c* and from the face 10*a*. It may have a dopant density that may be comprised between about $5 \times 10^{18}$ and $3 \times 10^{20}$ at/cm$^3$.

The second region 12, which here is p+-doped, lies, in the XY-plane, flush with the face 10*a*, and here extends from the lateral border 10*c*. It therefore extends along the Z-axis from the face 10*a*. It may have a thickness that is substantially uniform along the Z-axis and thus only be flush with a lower zone of the lateral border 10*c*. As a variant, as illustrated in FIG. 1A, the p+-doped second region 12 may have a p+-doped lateral region 14 that is continuously flush with the lateral border 10*c* along the Z-axis and that extends around the entire periphery of the detecting section 10. The p+-doped second region 12 may have a dopant density that may be comprised between about $10^{18}$ and $10^{20}$ at/cm$^3$.

The intermediate region 13 is located between the two n+-doped and p+-doped regions 11, 12. It therefore encircles the n+-doped first region 11 in the XY-plane and is here locally flush with the face 10*b*. It is here intrinsic so as to form a PIN junction but may be doped the second conductivity type, p-type for example, to form a PN junction.

The photodiode 1 comprises an antireflection layer 20, which extends over and in contact with the detecting section 10, and here in contact with the face 10*a*. It also extends facing the peripheral section 31 (described in detail below), which encircles the detecting section 10 in the XY-plane and is made of a second crystalline semiconductor the coefficient of thermal expansion of which is lower than that of the first crystalline semiconductor of the detecting section 10. The antireflection layer 20 is designed to limit the reflection of the incident light radiation by the detecting section 10, thus improving the absorbance associated with the photodiode 1. It forms a face for receiving the light radiation intended to be detected. It is formed from a stack of a plurality sublayers 21, 22, 23 that lie parallel to one another. The antireflection layer 20 in particular comprises a sublayer 22 referred to as the seed layer, located, in this example, between a first sublayer 21 located in contact with the face 10a of the detecting section 10 and an opposite third sublayer 23.

The seed sublayer 22 is made of the second crystalline semiconductor. In this example, the second crystalline semiconductor is silicon, the coefficient of thermal expansion of which is equal to $2.6 \times 10^{-6}$ K$^{-1}$, and the first crystalline semiconductor is germanium, the coefficient of thermal expansion of which is equal to $5.9 \times 10^{-6}$ K$^{-1}$. The silicon of the seed sublayer 22 is preferably single-crystal and intrinsic, while the silicon of the peripheral section 31 is highly doped the second conductivity type, here p+-type. The peripheral section 31 is in contact with the seed sublayer 22. Moreover, in the case of a matrix array of photodiodes 1, the seed sublayer 22 extends continuously facing the various detecting sections 10 and the corresponding peripheral sections 31.

The first sublayer 21 is made of an electrically insulating material, for example of a dielectric. It is here formed from a stack of two sublayers 21.1, 21.2 referred to as bonding sublayers, for example made of a silicon oxide such as tetraethyl orthosilicate (TEOS), which were used during the fabricating process to ensure the oxide-oxide bond of an SOI substrate and of a GeOI substrate, as described in detail below. The first sublayer 21 is placed between and in contact with the detecting section 10 and the seed sublayer 22. It is moreover passed through, along the Z-axis, by the peripheral section 31. Moreover, in the case of a matrix array of photodiodes 1, the first sublayer 21 extends continuously facing the various detecting sections 10 and the corresponding peripheral sections 31.

The third sublayer 23 is made of an electrically insulating material, for example of a dielectric, and here of a silicon oxide. The third sublayer 23 is placed in contact with the seed sublayer 22. It is made of a material having a refractive index lower than that of the seed sublayer 22 (here made of silicon) and that of the detecting section 10 (here made of germanium).

The various sublayers 21, 22, 23 are designed in terms of thickness and refractive index to optimize the transmission of the incident light radiation into the interior the detecting section 10. By way of example, in the case of a wavelength $\lambda$ of the light radiation to be detected equal to about 1550 nm, the first sublayer 21 may be made of TEOS of refractive index $n_1$ equal to 1.47 and of thickness equal to about 263 nm, the seed sublayer 22 may be made of intrinsic single-crystal silicon of refractive index $n_2$ equal to 3.42 and of thickness equal to about 226 nm, and the third sublayer 23 may be made of SiO$_2$ of refractive index $n_3$ equal to 1.47 and of thickness of about 263 nm. In this case, the reflection coefficient of the light radiation to be detected at the face 10a of the detecting section 10 is about 11%, while it is about 48% in the absence of such an antireflection layer 20.

Figure 2A:
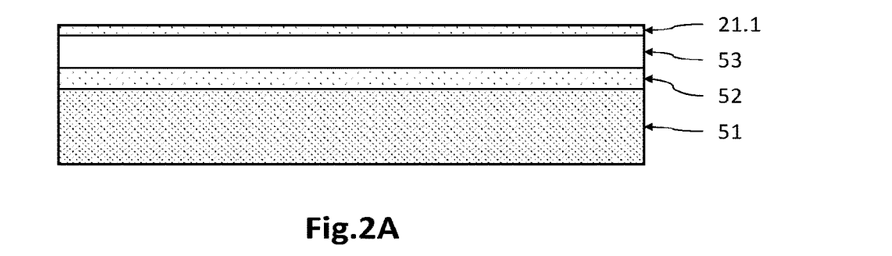
FIGS. 2A to 2K illustrate, schematically and partially, various steps of a process for fabricating at least one planar photodiode that is identical or similar to that illustrated in FIG. 1A.
Figure 2B:
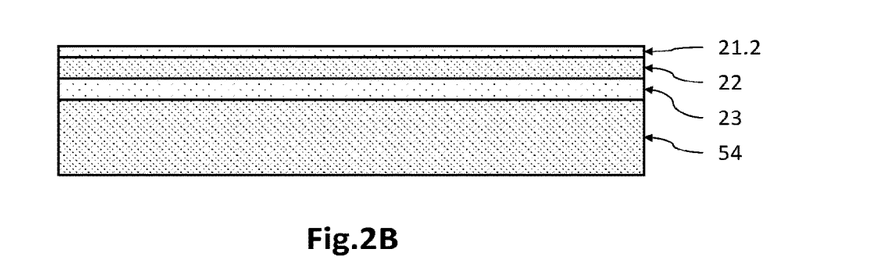
Figure 2C:
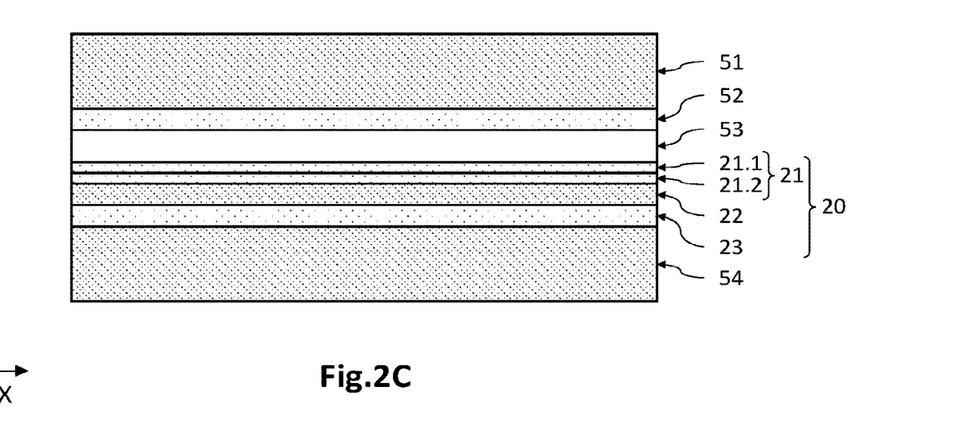
Figure 2D:
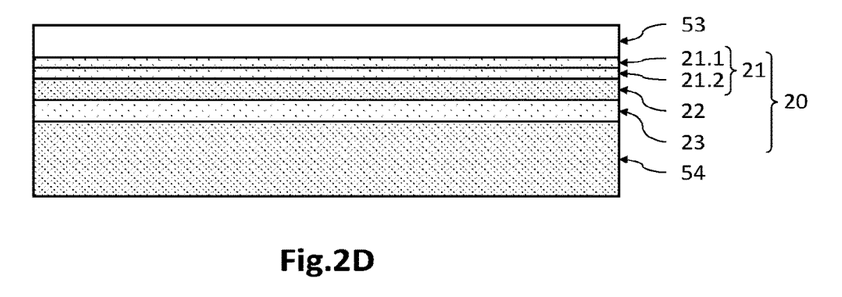
Figure 2E:
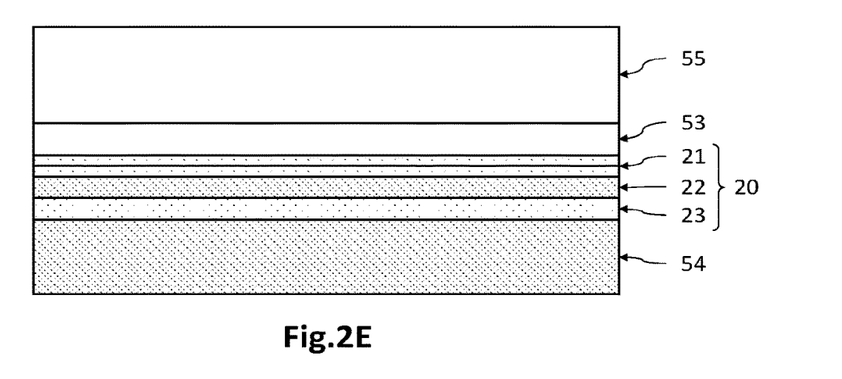
Figure 2F:
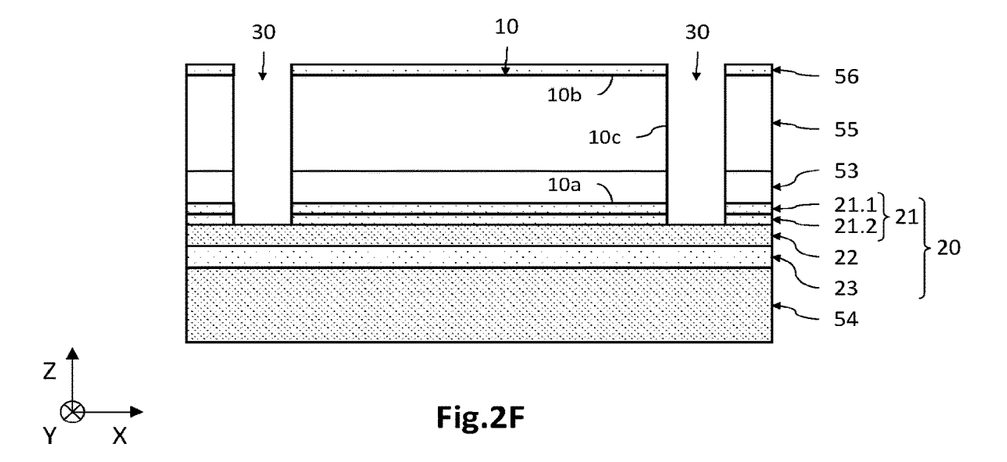

The detecting section 10 of the photodiode 1 is here bounded laterally, in the XY-plane, by a peripheral trench (see FIG. 2F), which extends around the detecting section 10 preferably continuous. It is filled with the second crystalline semiconductor, which is doped the second conductivity type and here forms a p+-doped peripheral section 31. The peripheral section 31 here extends right through the thickness of the detecting section 10 and passes through the first sublayer 21 of the antireflection layer 20, in order to emerge onto the seed sublayer 22. The p+-doped peripheral section 31 is then in contact with the seed sublayer 22, and with the lateral border 10c of the detecting section 10. The second crystalline semiconductor has a coefficient of thermal expansion lower than that of the first semiconductor. In the case of a detecting section 10 based on germanium, the peripheral section 31 and the seed sublayer 22 are made based on silicon, and are preferably made of silicon, for example polysilicon, or even SiGe or an alternation of Si/SiGe. The peripheral section 31 has an epitaxy relationship with the seed sublayer 22, insofar as, as described below, the peripheral section 31 was produced by epitaxy from the seed sublayer 22. By epitaxy relationship, what is meant is that the crystal structure of the p+-doped silicon of the peripheral section 31 has an alignment of its crystal orientations, in at least one direction in the plane of the material and preferably in at least one direction orthogonal to the plane of the material, with those of the crystal structure of the seed silicon.

Figure 1B:
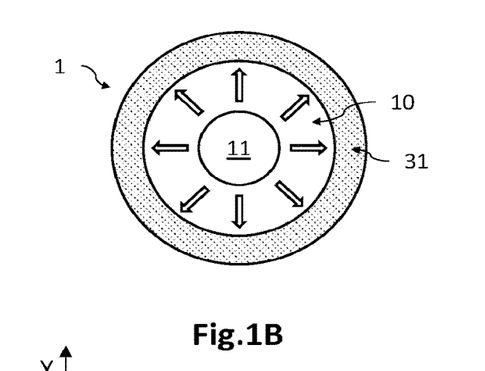
FIGS. 1B and 1C are schematic and partial views from above of a planar photodiode according to variants of the embodiment illustrated in FIG. 1A.
Figure 1C:
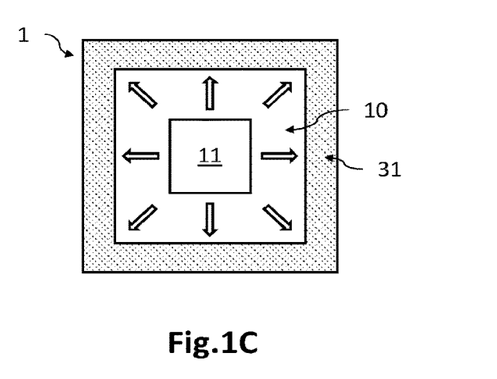

As illustrated in FIGS. 1B and 1C, the peripheral section 31 may have various shapes in the XY-plane, for example an oval or circular shape (FIG. 1B), or even a polygonal shape, a square shape for example (FIG. 1C). Other shapes are possible, as illustrated below with reference to FIGS. 3A and 3B.

A hybridization layer 32 covers the face 10b of the detecting section 10. It is here in contact with the intermediate region, which here is flush with the face 10b, and is in contact with the n+-doped first region 11. It is made of a dielectric, such as a silicon oxide, a silicon nitride, or a silicon oxynitride. Other dielectrics may be used, such as a hafnium or aluminum oxide, or even an aluminum nitride, inter alia. It has a thickness comprised for example between 50 nm and 500 nm. Contact metallizations 34 extend through the hybridization layer 32, and make contact with the n+-doped first region 11 and the p+-doped peripheral section 31.

The matrix array of photodiodes 1 is assembled with a control chip (not shown). The hybridization of the matrix array of photodiodes 1 with the control chip, i.e. the mechanical assembly and the electrical connection, is carried out by hybrid direct bonding (also called hybrid molecular bonding). The connection face of the control chip may be coated with an insulating layer that is made of a dielectric and that is passed through by contact metallizations. The hybrid direct bond is achieved via mechanical contact between the contact metallizations and via mechanical contact between the passivation layer and the insulating layer (see FIG. 2K).

The detecting section 10 is tensilely mechanically strained in the XY-plane, liable to make the band structure of the first crystalline semiconductor, here germanium, direct. This tensile strain is due to fact that the crystalline material (here silicon) of the peripheral section 31 has a coefficient of thermal expansion lower than that of the crystalline material (here germanium) of the detecting section 10, and that the peripheral section 31 is produced by epitaxy from the seed sublayer 22. Thus, during cooling after the epitaxy of the peripheral section 31, the crystalline germanium of the detecting section 10 remains tensilely strained by the crystalline silicon of the peripheral section 31. In addition, the fact that the crystalline silicon of the peripheral section 31 is grown by epitaxy from the seed sublayer 22 allows the detecting section 10 to be kept under a tensile stress, preventing the latter from relaxing in the XY-plane.

Moreover, the fact that the crystalline material (here silicon) of the peripheral section 31 is identical to that of the seed sublayer 22 (with the exception of the doping) allows an epitaxial material of high crystal quality (few crystal defects of the "dislocations due to lattice mismatch" type) to be obtained, this contributing to improving the magnitude and spatial uniformity of the tensile strain. Specifically, dislocations in the peripheral section 31 may lead to a decrease in the local magnitude and therefore in the spatial uniformity of the tensile strain in the detecting section 10. Moreover, preferably, the peripheral section 31 protrudes with respect to the two faces 10a, 10b of the detecting section 10, this allowing the spatial uniformity of the tensile strain in the detecting section 10 to be further improved.

It is thus possible to obtain a photodiode 1 with a detecting cut-off wavelength higher than 1550 nm, or even 1620 nm (i.e. one that is able to be employed in the field of optical telecommunications), with a high sensitivity. The antireflection layer 20 therefore plays two roles, namely an optical role decreasing the reflection of the light radiation incident on the interface of the detecting section 10, and a crystallographic and mechanical role allowing the crystalline material of the peripheral section 31 to seed and the peripheral section 31 to mechanically attach to the seed sublayer 22, thus allowing the detecting section 10 to be kept under tension.

In addition, the photodiode 1 has a small bulk, insofar as the peripheral section 31 is substantially coplanar with the detecting section 10. Such an arrangement of the peripheral section 31 with respect to the detecting section 10 of each of the photodiodes allows a high spatial density of photodiodes 1 to be obtained, and therefore a high spatial resolution in the case of a matrix array of photodiodes 1.

An example of a process for producing the matrix array of tensilely strained planar photodiodes as illustrated in FIG. 1A is now described with reference to FIGS. 2A to 2K.

In a first step (FIG. 2A), a GeOI substrate (GeOI standing for germanium-on-insulator) is produced. Thus, a first semiconductor layer 53 of single-crystal germanium is produced, secured to a carrier layer 51, here made of silicon, via an insulating layer 52, here made of a silicon oxide. This stack is preferably produced by means of the process described in the publication by Reboud et al. entitled *Structural and optical properties of 200 mm germanium-on-insulator (GeOI) substrates for silicon photonics applications,* Proc. SPIE 9367, Silicon Photonics X, 936714 (Feb. 27, 2015). Such a process has the advantage of delivering a first semiconductor layer 53 of germanium exhibiting an almost total absence of structural defects such as dislocations. The germanium is here doped p+-type by means of gallium or boron. The first semiconductor layer 53 may have a thickness comprised between about 20 nm and 600 nm, and for example equal to about 300 nm. The insulating layer 52 (or BOX, acronym of buried oxide) may have a thickness comprised between 50 nm and 1 µm. The first semiconductor layer 53 is covered with a dielectric layer 21.1 that is referred to as a bonding layer, made of an oxide, of TEOS for example. As described below, this dielectric bonding layer 21.1 allows the GeOI substrate to be bonded with an SOI substrate, and contributes to forming the first sublayer 21 of the antireflection layer 20.

In another step (FIG. 2B), an SOI substrate (SOI standing for silicon-on-insulator) is produced. A layer 22 made of the second crystalline semiconductor and here made of crystalline and preferably single-crystal silicon, is thus produced, this layer being intended to form the seed sublayer of the reflection layer 20. It is joined to a carrier layer 54, here made of silicon, by a dielectric layer 23, here a BOX layer made of silicon oxide, which forms the third sublayer of the antireflection layer 20. A dielectric layer 21.2, which is referred to as a bonding layer and made of an oxide, TEOS for example, is produced, covering the silicon layer 22. This dielectric bonding layer 21.2 allows the SOI substrate to be bonded with the GeOI substrate, and contributes to forming the first sublayer 21 of the antireflection layer 20.

In a following step (FIG. 2C), the GeOI substrate is joined to the SOI substrate by oxide-oxide bonding, bringing the free faces of the two dielectric bonding layers 21.1, 21.2 into contact. The bonding may be carried out at room temperature, and chemical mechanical polishing may be carried out on the free face of the silicon carrier layer 51 of the GeOI to obtain a planar face. A consolidating anneal may be carried out to strengthen the adhesion between the two dielectric bonding layers 21.1, 21.2, at a temperature for example comprised between 200° C. and 600° C. The first semiconductor layer 53 made of p+-doped germanium thus rests on a stack of a plurality of layers forming the antireflection layer 20, namely the first sublayer 21 formed by the two dielectric bonding layers 21.1, 21.2, the silicon layer forming the seed sublayer 22, and the third sublayer 23.

In a following step (FIG. 2D), a face opposite to the antireflection layer 20 of the first semiconductor layer 53 of p+-doped germanium is freed. To do this, the carrier layer 51 of the GeOI substrate is removed, for example by grinding that is stopped so as to leave behind a residual silicon portion that is about 10 to 20 µm in thickness, followed by removal of the residual portion by physical etching (e.g. plasma etching) or wet etching. The face of the insulating layer 52 of the GeOI substrate is thus freed. The insulating layer 52 is then removed, for example by physical etching (e.g. plasma etching) or by wet etching, thus freeing the face of the first semiconductor layer 53 made of p+-doped germanium of the GeOI substrate.

In a following step (FIG. 2E), a second semiconductor layer 55 made of the first crystalline semiconductor, here of germanium, is produced. Thus, after cleaning of the free face of the first semiconductor layer 53 so as to deoxidize the surface, the second semiconductor layer 55, here made of intrinsic germanium, is grown by epitaxy from the free face of the first semiconductor layer 53 made of p+-doped germanium. The epitaxy temperature may be comprised between 400° C. and 850° C., and preferably between 700° C. and 850° C., so as to increase the tensile strain in the detecting section at the end of the fabricating process. Specifically, carrying out the epitaxy at high temperature may make it possible to avoid various contaminants and to increase the difference in the coefficients of thermal expansion (CTEs) between zone 31 and zone 10, this possibly increasing the tensile strain in the detecting section after room temperature has been returned to. The second semiconductor layer 55 has a thickness that depends on the wavelength range of the light radiation to be detected. In the case of a SWIR photodiode, it may have a thickness comprised between 0.5 µm and 3 µm, and for example equal to about 1.5 µm. It is intended to form the light-absorption zone of the photodiodes. It contains a very low number of structural defects of the dislocation type, insofar as it is grown epitaxially from the germanium of the first semiconductor layer 53, this making it possible to improve the absorption of the detecting section of the photodiode. In addition, anneals may be carried out to decrease the number of dislocations.

In a following step (FIG. 2F), the peripheral trenches 30 are produced. To do this, a protective layer 56 made of a dielectric is first deposited on the free face of the second semiconductor layer 55 made of intrinsic germanium. This protective layer 56 may be made of a silicon oxide, and may have a thickness comprised between about 50 nm and 200 nm. Next, by photolithography and etching, the peripheral trenches 30 are produced so as to define detecting sections 10. The latter are bounded by the faces 10a, 10b and by the lateral border 10c. Each peripheral trench 30 preferably extends continuously in the XY-plane so as to define one germanium detecting section 10. It extends along the Z-axis through the second semiconductor layer 55 made of intrinsic germanium, through the first semiconductor layer 53 made of p+-doped germanium, and through the two dielectric bonding layers 21.1, 21.2, to open onto the seed sublayer 22 made of intrinsic silicon. It may extend in the XY-plane so as to form a circle or a square, inter alia. It has, along the Z-axis, a substantially uniform width that may be comprised between 0.5 µm and 2 µm.

In a following step (FIG. 2G), the peripheral sections 31 made of p+-doped silicon are produced. To do this, p+-doped silicon is grown epitaxially from the free surface of the seed sublayer 22. The epitaxy temperature is higher than room temperature, which may be equal to 25° C., and may be comprised between about 500° C. and 700° C., i.e. to within 10%, and is preferably comprised between about 600° C. and 700° C., so as to form, or participate in forming, the lateral region 14 based on SiGe. The epitaxially grown silicon grows from the seed sublayer 22 and fills the peripheral trenches 30. It is therefore in contact with the lateral border 10c of the germanium detecting sections 10. It is deposited so as to overflow peripheral trenches 30 and thus covers the protective layer 56.

Figure 2G:
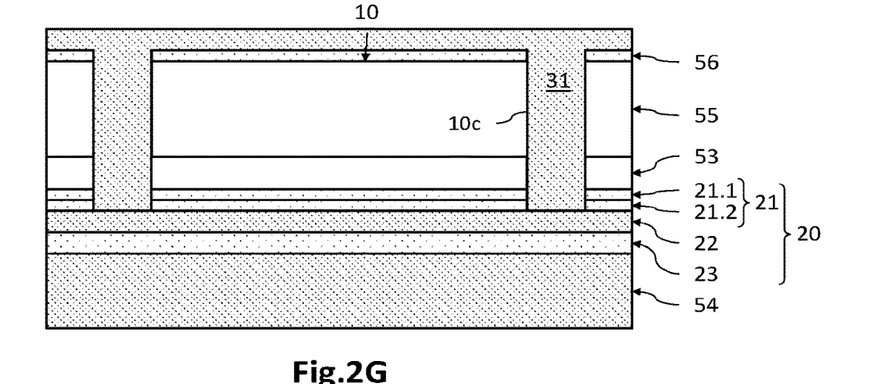
Figure 2H:
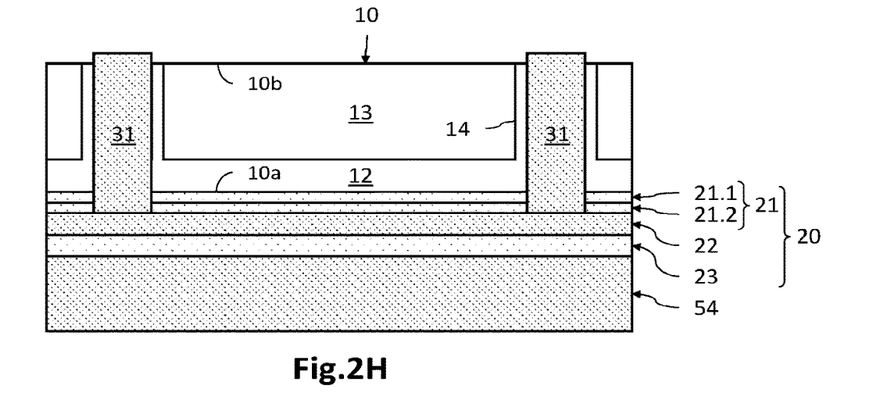
Figure 2I:
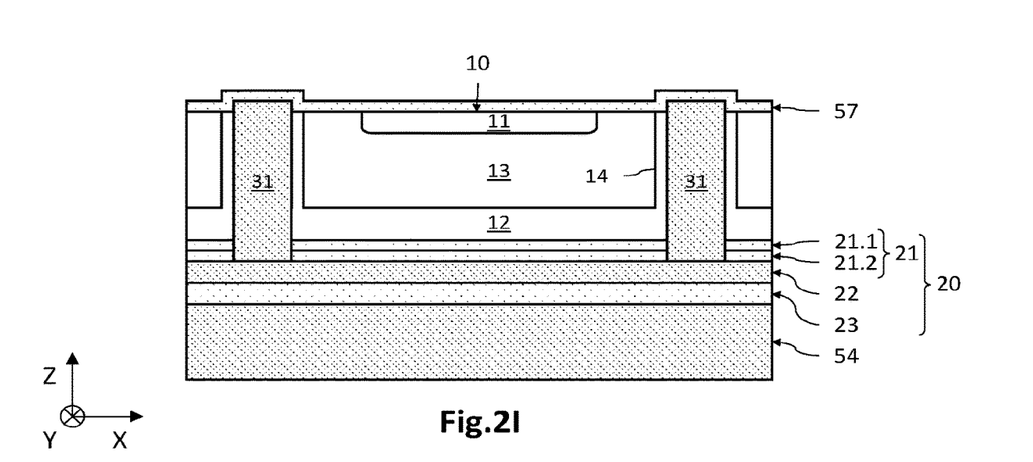

Following the step of epitaxial growth, the temperature is decreased to a final temperature below the epitaxy temperature, for example to room temperature, to 25° C. for example, this causing the germanium of the detecting sections 10 to be placed under tension. Specifically, in the step of epitaxial growth of the p+-doped silicon, the germanium of the detecting sections 10 expands, notably in the XY-plane, due to its coefficient of thermal expansion equal to $5.9 \times 10^{-6}$ K$^{-1}$. The lattice parameter of the germanium in the XY-plane then changes from the relaxed value of 5.658 Å at room temperature to an expanded value of 5.681 Å at about 700° C. The epitaxially grown silicon fills the peripheral trenches 30 and has, in the XY-plane, an expanded lattice parameter that for example is equal to 5.441 Å at about 700° C. (the initial value being equal to 5.431 Å at room temperature) due to its coefficient of thermal expansion equal to $2.6 \times 10^{-6}$ K$^{-1}$. During the cooling step, due to the mechanical coupling between the peripheral section 31 (i.e. the epitaxially grown silicon located in the peripheral trench 30) and the germanium of the corresponding detecting section 10, the germanium is strained depending on the coefficient of thermal expansion of the silicon and no longer depending on its own coefficient of thermal expansion. Insofar as the coefficient of thermal expansion of silicon is lower than that of germanium, the germanium has a lattice parameter in the XY-plane equal to 5.671 Å at room temperature, this corresponding to an expansion of the order of about 0.22% compared to its relaxed value of 5.658 Å. Thus, the germanium of the detecting section 10 is effectively tensilely strained at the end of the cooling step by the silicon of the peripheral section 31. In addition, it remains strained because the silicon of the peripheral section 31 is joined via an epitaxy relationship to the silicon of the seed sublayer 22. The latter therefore ensures that the various peripheral sections 31 are held in place mechanically, and thus keeps the detecting sections 10 tensilely strained, insofar as it prevents them from relaying in the XY-plane.

In a following step (FIG. 2H), the silicon resting on the protective layer 56 is removed, for example by chemical-mechanical polishing that is stopped on the protective layer 56. A diffusion anneal may be carried out, for example at a temperature comprised between 700° C. and 800° C., so as to cause the diffusion of dopants, here boron, from the p+-doped silicon of the peripheral section 31 into the intrinsic silicon of the detecting section 10, so as thus to form a p+-doped lateral region 14. Simultaneously, a lateral gap-opening zone is formed by interdiffusion between the germanium of the detecting section 10 and the silicon of the peripheral section 31. Next, the protective layer 56 is removed. The peripheral section 31 then protrudes with respect to the detecting section 10 along the Z-axis, both from the face 10a and from the face 10b, here over a height of the order of about 100 nm for as regards the face 10b. This contributes to improving the spatial uniformity of the tensile strain within the detecting section 10.

In a following step (FIG. 2I), the n+-doped first sections 11 are produced. To do this, a protective layer 57 made of a dielectric, for example of a silicon oxide, with a thickness for example comprised between about 10 nm and 30 nm, is deposited. Next, by photolithography, apertures corresponding to implantation zones defining the n+-doped first regions 11 are defined in a photoresist (not shown). Next, ion implantation of a dopant such as phosphorus or arsenic is carried out through the apertures. The first regions 11 are preferably n+ overdoped, and may thus have a dopant density comprised between about $5 \times 10^{18}$ and $3 \times 10^{20}$ at/cm$^3$. The n+-doped first regions 11 thus form n+-doped wells bounded, in the XY-plane and along the Z-axis, by the intermediate region 13 made of intrinsic germanium. After removal of the photoresist, an anneal may be carried out to diffuse the dopants, for example at a temperature comprised between 400° C. and 750° C. for a time from a few seconds to a few tens of minutes, and for example at 600° C. for 10 s.

In a following step (FIG. 2J), a layer 32 allowing the matrix array of photodiodes to be hybridized with a control chip is produced. To do this, the protective layer 57 is completely removed, for example by plasma etching or by wet etching, and a passivation layer 33 is deposited so as to cover the detecting sections 10 and the peripheral sections 31. The passivation layer 33 is made of a dielectric, for example a silicon oxide, nitride or oxynitride, an aluminum oxide or nitride, or a hafnium oxide, inter alia. The passivation layer may have a thickness for example comprised between 10 nm and 500 nm.

Figure 2J:
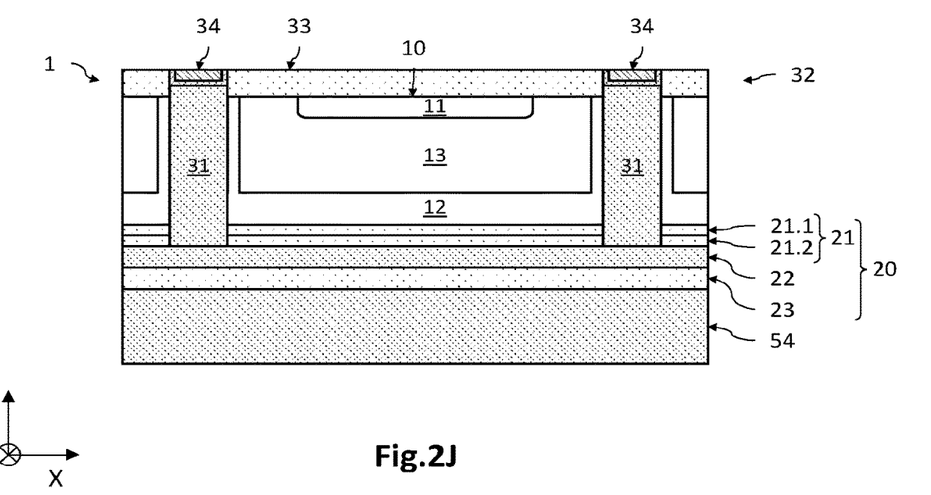

Apertures are then produced by localized etching of the passivation layer 33, which open onto the peripheral sections 31 and onto the n+-doped first regions 11. Contact metallizations 34 are then produced in the apertures, which may be formed from a Ti/TiN cladding and a core made of tungsten W or of copper. To do this, a thin metal layer is deposited in the apertures by conformal deposition, this layer for example being formed from a sublayer of titanium Ti of a thickness of about 5 nm then from a sublayer of titanium nitride TiN of a thickness of about 10 nm. An anneal is carried out so as to improve the electrical contact between the titanium and the germanium on the one hand, and between the titanium and the silicon on the other hand. During this anneal, the n+-doped germanium of the first regions 11 diffuses so as to occupy a larger volume in the detecting section 10. A metal layer, for example made of tungsten W or of copper Cu, is then deposited so as to fill the apertures. A chemical-mechanical polishing step stopped on the passivation layer 33 is then carried out. Contact metallizations 34 that are formed from a Ti/TiN cladding and from a W or Cu core, that are located in the passivation layer 33 and that pass through the latter, are thus obtained.

In a following step (FIG. 2K), the matrix array of photodiodes 1 thus obtained is hybridized with a control chip 40. The connection face of the control chip may thus be coated with an insulating layer 41 that is made of a dielectric and that is passed through by contact metallizations 42. The matrix array of photodiodes 1 and the control chip 40 are thus assembled by hybrid direct bonding, via contact of the faces formed from the contact metallizations 34, 42 and from the insulating layers 33, 41. A bonding anneal may be carried out so as to increase the bonding energy per unit area between the two faces in contact.

Figure 2K:
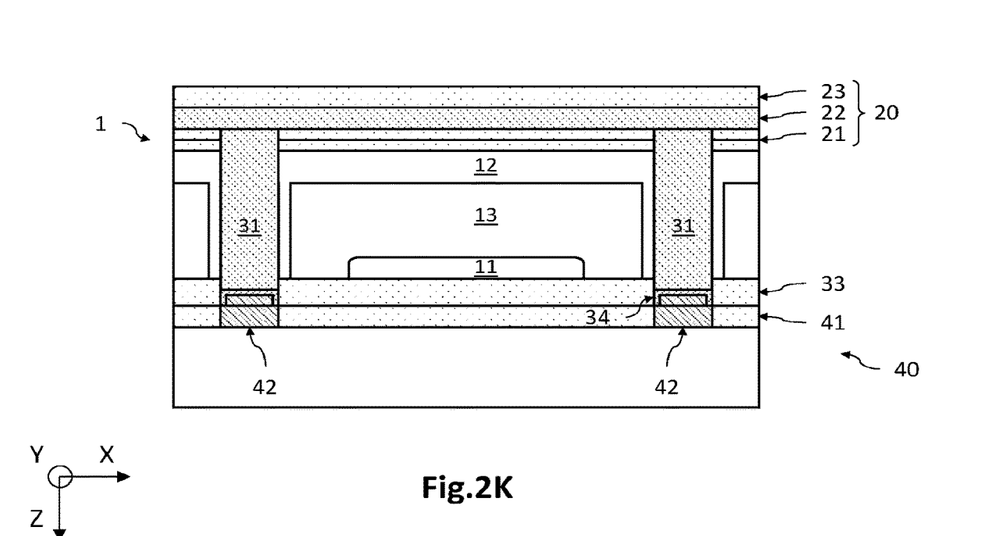

Next, the carrier layer 54 is removed from the SOI substrate, for example by grinding, so as to expose the third sublayer 23 of the antireflection layer 20. This thus forms the face for receiving the light radiation to be detected.

The fabricating process thus allows one or more planar, tensilely-strained photodiodes 1 to be obtained. Thus, more precisely, the detecting sections 10 are tensilely strained following the step of epitaxial growth of the peripheral sections 31, because the latter are made of a material the coefficient of thermal expansion of which is lower than that of the material of the detecting sections.

In addition, the fact that the peripheral sections 31 are obtained by epitaxy from the seed sublayer 22, which extends continuously under the detecting sections 10, makes it possible to ensure that the detecting sections 10 remain tensilely strained, preventing in practice these sections from relaxing in the XY-plane. The antireflection layer 20 then plays a dual role allowing the reflection of the light radiation to be detected at the interface of the germanium to be decreased, and ensuring the detecting sections 10 remain mechanically strained via the peripheral sections 31.

Moreover, the fabricating process allows detecting sections 10 made of a germanium of high crystal quality to be obtained, via the use of a GeOI substrate. Moreover, the seed sublayer 22 is made of high crystal quality silicon because of the use of an SOI substrate. The fabricating process thus uses GeOI and SOI substrates joined together. The dielectric bonding layers 21.1, 21.2 form one of the low-refractive-index sublayers of the antireflection layer 20.

Some particular embodiments have just been described. Various variants and modifications will appear obvious to those skilled in the art.

Figure 3A:
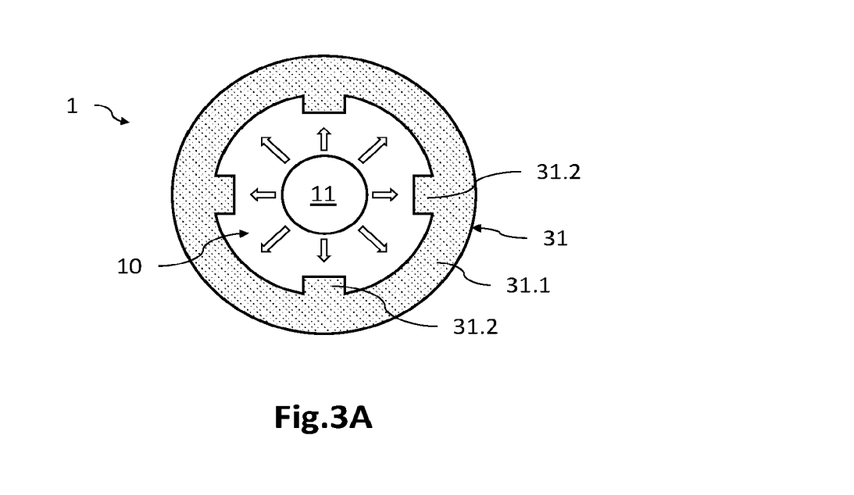
FIGS. 3A and 3B are schematic and partial views from above of a planar photodiode according to other variants of the embodiment illustrated in FIG. 1A.
Figure 3B:
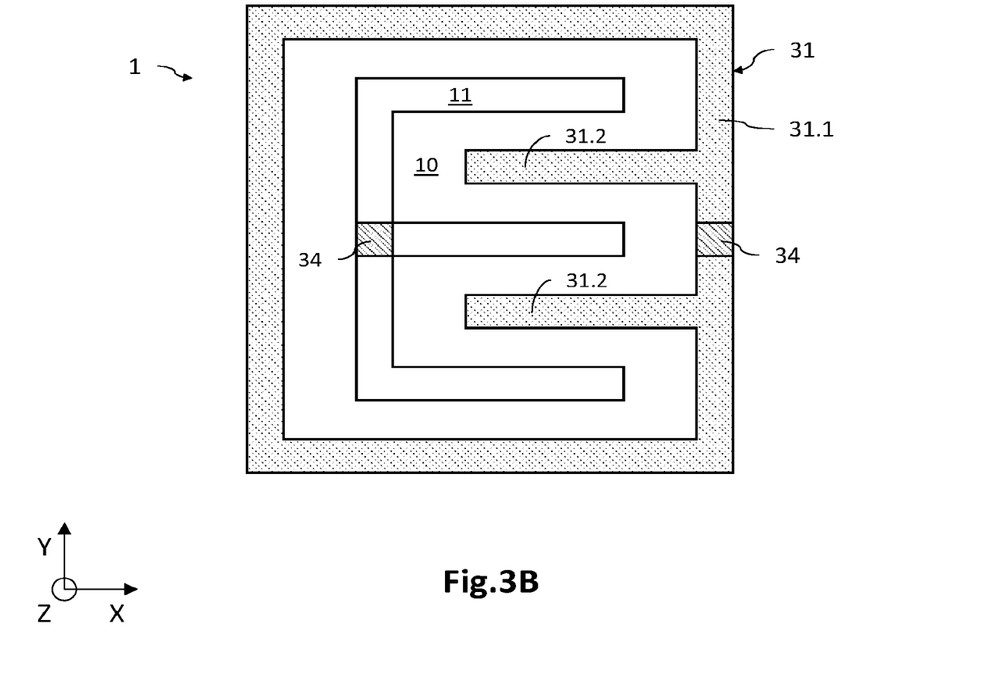

In this regard, FIGS. 3A and 3B are schematic and partial views from above of a planar, tensilely strained photodiode 1 according to variants of the embodiment illustrated in FIG. 1A.

In the example of FIG. 3A, the peripheral section 31 extends in a circular manner around the detecting section 10 and its n+-doped first region 11. It has here, in the XY-plane, a substantially circular main portion 31.1, and projecting portions 31.2, or protuberances, which extend from the circular main portion 31.1 in the direction of the n+-doped first region 11. These projecting portions 31.2 here have a rectangular shape in the XY-plane, but other shapes are possible. In this example, they are arranged in pairs symmetrically with respect to the center of the n+-doped first region 11. Be that as it may, these projecting portions 31.2 of the peripheral section 31 make it possible to distribute and optimize the tensile strain within the detecting section 10.

In the example of FIG. 3B, the peripheral section 31 extends in a rectangular manner around the detecting section 10. It comprises a substantially rectangular main portion 31.1, and projecting portions 31.2 that extend from the main portion 31.1 in the direction of the n+-doped first region 11. These projecting portions 31.2 here extend in a rectilinear manner. In this example, the n+-doped first region is "interdigitated", i.e. it is formed from various portions that are connected to one another, and that extend continuously between the projecting portions 31.2 on the one hand, and between the projecting portions 31.2 and the main portion 31.1 on the other hand. One or more contact metallizations 34 may be placed locally in contact with the n+-doped first region 11 and the peripheral section 31. In this example, the photodiode 1 may have a dimension in the XY-plane comprised between about 10 µm and 100 µm, and the peripheral section 31 may have a width in the XY-plane comprised between about 1 µm and 2 µm. Other shapes and arrangements of the peripheral section 31 and of the n+-doped first region 11 are of course possible.

The invention claimed is:

1. Process for fabricating at least one planar photodiode, comprising the following steps:
   producing a stack formed:
      from at least one semiconductor layer made based on a first crystalline semiconductor; and
      from an antireflection layer that extends in contact with a first face of the semiconductor layer and that is formed from a plurality of sublayers that lie parallel to one another, including a seed sublayer which is made based on a second crystalline semiconductor having a coefficient of thermal expansion lower than that of the first crystalline semiconductor;
   producing at least one peripheral trench that extends through the semiconductor layer from a second face thereof opposite the first face and that opens onto the seed sublayer, bounding a detecting section of the semiconductor layer;
   producing a peripheral section made of the second crystalline semiconductor by epitaxy from the seed sublayer at an epitaxy temperature higher than room temperature, entirely filling the peripheral trench and thus being in contact with the detecting section;
   decreasing the temperature to a value lower than the epitaxy temperature, the detecting section then being tensilely strained by the peripheral section.

2. Fabricating process according to claim 1, comprising the following steps:
   producing a first substrate comprising a first semiconductor layer made of the first crystalline semiconductor, this layer being coated with a first bonding dielectric layer;
   producing a second substrate comprising a layer made of the second crystalline semiconductor, this layer being intended to form the seed sublayer, coated with a second bonding dielectric layer and joined to a carrier layer by an insulating layer;
   joining the two substrates to each other by direct bonding of the first and second bonding dielectric layers, and thus obtaining the antireflection layer, the first and second bonding dielectric layers forming a first sublayer of the antireflection layer and the insulating layer forming a third sublayer of the antireflection layer.

3. Fabricating process according to claim 1, wherein the detecting section is made based on germanium, and the peripheral section and the seed sublayer are made based on silicon.

4. Fabricating process according to claim 3, wherein the epitaxy temperature is comprised between 500° C. and 700° C.

5. Fabricating process according to claim 1, wherein a plurality of planar photodiodes are produced, the seed sublayer extending continuously facing each photodiode, the peripheral sections being produced by epitaxy from the seed sublayer.

6. Optoelectronic device comprising at least one planar photo diode, said photodiode comprising:
- a detecting section that has a first face and a second face parallel to each other, that is made of a first crystalline semiconductor and that is tensilely strained in a plane parallel to said faces;
- an antireflection layer that extends over and in contact with the first face of the detecting section, formed from a plurality of sublayers that lie parallel to one another, including a seed sublayer which is made based on a second crystalline semiconductor having a coefficient of thermal expansion lower than that of the first crystalline semiconductor;
- a peripheral section made of the second crystalline semiconductor, extending around and in contact with the detecting section, and in contact, under an epitaxy relationship, with the seed sublayer.

7. Optoelectronic device according to claim 6, wherein the peripheral section protrudes with respect to the first face and with respect to the second face.

8. Optoelectronic device according to claim 6, wherein the detecting section comprises a first region that is doped a first conductivity type and that lies flush with the second face, and a second region that is doped a second conductivity type opposite the first type and that lies flush with the first face and that is in contact with the peripheral section, the peripheral section being doped the second conductivity type.

9. Optoelectronic device according to claim 8, wherein the detecting section comprises an intermediate region that is intrinsic or doped the second conductivity type, separating the first region from the second region.

10. Optoelectronic device according to claim 6, wherein the peripheral section encircles the detecting section continuously.

\* \* \* \* \*